US006723927B1

United States Patent
Fan et al.

(10) Patent No.: US 6,723,927 B1
(45) Date of Patent: Apr. 20, 2004

(54) HIGH-RELIABILITY INTERPOSER FOR LOW COST AND HIGH RELIABILITY APPLICATIONS

(75) Inventors: Zhineng Fan, Santa Clara, CA (US); Ai D. Le, Sunnyvale, CA (US); Che-Yu Li, Ithaca, NY (US)

(73) Assignee: High Connection Density, Inc., Sunnyvale, CA (US)

( * ) Notice: Subject to any disclaimer, the term of this patent is extended or adjusted under 35 U.S.C. 154(b) by 125 days.

(21) Appl. No.: 09/866,434

(22) Filed: May 29, 2001

Related U.S. Application Data
(60) Provisional application No. 60/227,689, filed on Aug. 24, 2000.

(51) Int. Cl.[7] .............................. H01R 12/04; H05K 1/11
(52) U.S. Cl. ........................................ 174/262; 439/65
(58) Field of Search ................................. 174/260

(56) References Cited

U.S. PATENT DOCUMENTS

| | | | | |
|---|---|---|---|---|
| 4,029,375 A | * | 6/1977 | Gabrielian | .................. 439/66 |
| 4,553,192 A | * | 11/1985 | Babuka et al. | .............. 361/743 |
| 5,818,700 A | * | 10/1998 | Purinton | .................... 257/707 |
| 5,880,590 A | * | 3/1999 | Desai et al. | ................ 174/261 |
| 5,893,765 A | * | 4/1999 | Farnworth | ................... 439/66 |
| 5,984,691 A | * | 11/1999 | Brodsky et al. | .............. 439/66 |
| 6,044,548 A | * | 4/2000 | Distefano et al. | ...... 228/180.22 |
| 6,219,253 B1 | * | 4/2001 | Green | ........................ 165/185 |
| 6,332,782 B1 | * | 12/2001 | Bezama et al. | .............. 439/66 |
| 6,428,328 B2 | * | 8/2002 | Haba et al. | .................. 439/70 |
| 6,495,462 B1 | * | 12/2002 | Haba et al. | ................. 438/689 |

OTHER PUBLICATIONS

IBM Technical Disclosure Bulletin vol. 37, No. 02A Feb. 1994, pps. 277–278. "Improved and Cost–Reduced Interposer for Higher–Risk Processes".

* cited by examiner

Primary Examiner—Kamand Cuneo
Assistant Examiner—Jeremy Norris
(74) Attorney, Agent, or Firm—Salzman & Levy

(57) ABSTRACT

An interposer provides a high reliability interface between an LGA connector and a motherboard. The interposer includes a stepped spacer for each solder interconnection which prevents the relaxation of mechanical contact force while ensuring the integrity of each solder interconnection. The interposer provides noble metal plated contact pads on a first surface to receive the contact members of an LGA connector, and contact pads for BGA solder connections for attachment to a motherboard. A description of the processes to manufacture the interposer is also disclosed.

15 Claims, 6 Drawing Sheets

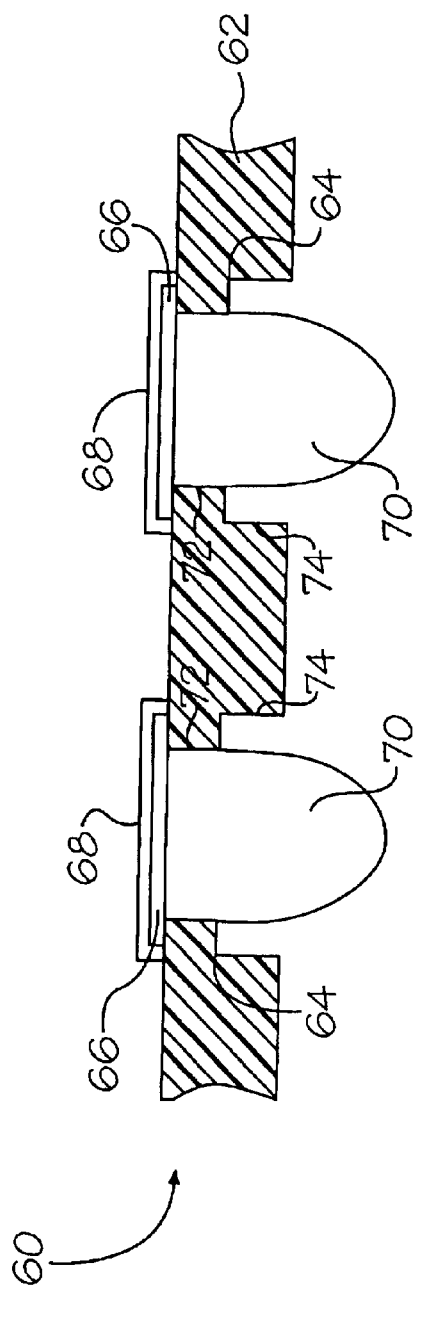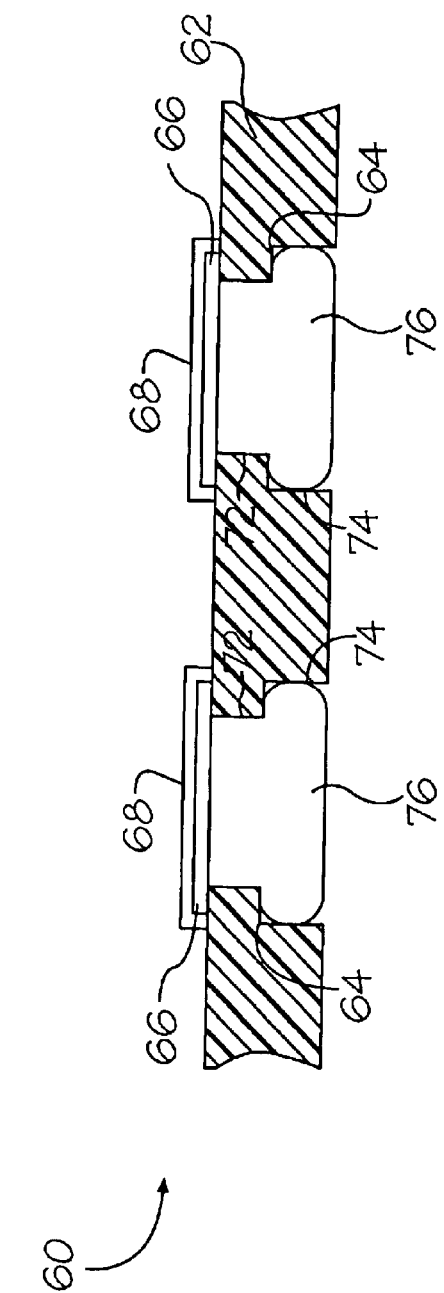

HIGH-RELIABILITY INTERPOSER FOR LOW COST AND HIGH RELIABILITY APPLICATIONS

This application claims the benefit of U.S. Provisional application Ser. No. 60/227,689, filed Aug. 24, 2000.

RELATED PATENT APPLICATIONS

This application is related to U.S. Pat. No. 6,264,476, issued to Li et al. for WIRE SEGMENT BASED INTERPOSER FOR HIGH FREQUENCY ELECTRICAL CONNECTION, which is based on application Ser. No. 09/457,776, filed Dec. 9, 1999 and U.S. Pat. No. 6,312,266, issued to Fan et al. for CARRIER FOR LAND GRID ARRAY CONNECTORS, which is based on U.S. patent application Ser. No. 09/645,860, filed Aug. 24, 2000, both of which are hereby incorporated by reference.

FIELD OF THE INVENTION

The present invention relates to electronic packaging structures such as printed circuit boards, circuit modules, or the like and, more particularly, to those structures requiring special plating processes such as gold plating for electrical contact.

BACKGROUND OF THE INVENTION

The current trend in the design of high speed electronic systems is to provide both high density and highly reliable interconnections between various circuit devices, which form important parts of these systems. The system may be a computer, a telecommunications network device, a hand-held "personal digital assistant", medical equipment, or any other electronic equipment. High reliability for such connections is essential due to potential end product failure, should vital misconnections of these devices occur. Further, to assure effective repair, upgrade, and/or replacement of various system components (i.e., connectors, cards, chips, boards, modules, etc.), it is also highly desirable that such connections be separable and reconnectable in the field within the final product. Also, with financial pressures on manufacturers to be cost competitive, is also important that high-dollar-value assemblies be reworkable to maximize yields and minimize the dollar-value of material to be scrapped.

Historically, connectors on computer motherboards used for allowing field-separable interconnection of semiconductor devices, such as microprocessors and memory modules, were primarily pin-grid-array (PGA) or spring loaded edge connector technology. Such connector technologies allow field upgrade or replacement of defective devices.

But as system density, input/output (I/O) array size and performance have increased so dramatically, so have the stringent specifications for interconnections. These demanding requirements, especially when coupled with the requirement for field-separability, have led to a wide variety of possible connector solutions, the majority of them requiring that mating pads on the motherboard be plated with a precious metal to ensure a reliable and repeatable electrical contact. This additional requirement adds cost to the motherboard so that such practice is not widely implemented.

A land grid array (LGA) is an example of such a connection in which the two primarily parallel circuit elements are connected. Each element has a plurality of contact points or pads, arranged in a linear or two-dimensional array. An array of interconnection elements, known as an interposer, is placed between the two arrays and provides the electrical connection between the contact points or pads. While LGA interposers described in the prior art are implemented in many different ways, the implementations of most interest are those described in the referenced copending U.S. patent applications.

Contact pads on motherboards commonly comprise copper and have a barrier layer of nickel followed by a thin (e.g., 0.001 inch) layer of gold. This plating combination works well for ball grid array (BGA) solder interconnections. It does not work as well, however, for LGA connectors, where a thicker layer of gold is required to ensure a reliable interconnection. Since a thicker gold layer is more costly than a thinner layer, motherboard manufacturers are reluctant to implement such a change.

One solution is proposed in the IBM Technical Disclosure Bulletin, Volume 37, Number 02A, pp. 277 and 278, published in February 1994. It describes an interposer that unfortunately falls short in meeting the requirements of present-day systems. This interposer is proposed to provide an array of electrical contact pads on a first surface for connection to an LGA connector, and on a second surface for BGA solder attachment to a motherboard. However, during service the solder interconnections will creep, thereby relaxing the contact force on individual contact members to the point that the LGA connector loses electrical contact.

A solution to this shortcoming is to provide a spacer of sufficient height to ensure that contact force is maintained at a relatively high level to ensure reliable connections but not so high as to prevent good BGA solder interconnections for all contacts. The concern is that some of the solder interconnections will not make electrical contact due to the non-planarity of the mating surfaces.

It is believed that a high reliability interposer that reduces the cost of a motherboard, while solving the solder creep problem discussed above, constitutes a significant advancement in the art.

It is, therefore, an object of the invention to enhance the electrical interconnection art.

It is another object of the invention to provide an interposer for high reliability that reduces the cost of a motherboard.

It is an additional object of the invention to provide an interposer that ensures the reliability of LGA connectors especially at high temperatures.

SUMMARY OF THE INVENTION

In accordance with the present invention, there is provided an interposer that functions as a high reliability interface between an LGA connector and a motherboard. The novel interposer overcomes the limitations of prior art interposers by including a stepped spacer for each solder interconnection which prevents the relaxation of mechanical contact force while ensuring the integrity of each solder interconnection. The interposer provides noble metal plated contact pads on a first surface to receive the contact members of an LGA connector, and contact pads for BGA solder connections for attachment to a motherboard. A description of the processes to manufacture the interposer is also disclosed.

BRIEF DESCRIPTION OF THE DRAWINGS

A complete understanding of the present invention may be obtained by reference to the accompanying drawings, when taken in conjunction with the detailed description thereof and in which:

FIGS. 6a and 6b are an enlarged side view of the interposer of FIG. 4 before and with, respectively, the effects of creep of the solder connections.

DETAILED DESCRIPTION OF THE PREFERRED EMBODIMENT

Generally speaking, the present invention features an interposer that provides a high reliability interface between an LGA connector and a motherboard. The novel interposer overcomes the limitations of prior art interposers by including a stepped spacer for each solder interconnection which prevents the relaxation of mechanical contact force while ensuring the integrity of each solder interconnection. The interposer provides noble metal plated contact pads on a first surface to receive the contact members of an LGA connector, and contact pads for BGA solder connections for attachment to a motherboard. Improved manufacturability and reliability are achieved with this invention.

Figure 1:
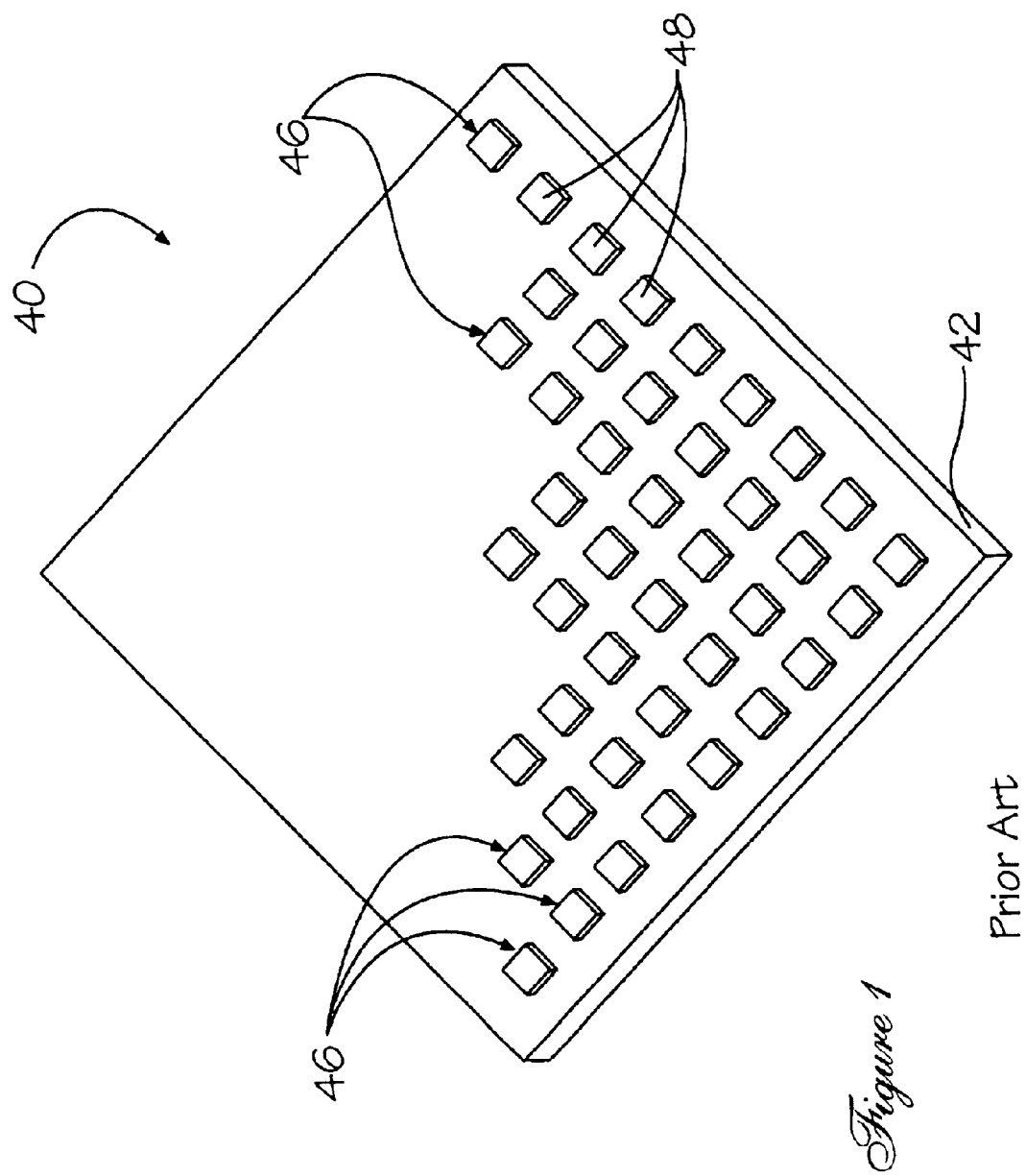
FIG. 1 is a partial perspective view of an interposer in accordance with the prior art.
Figure 2:
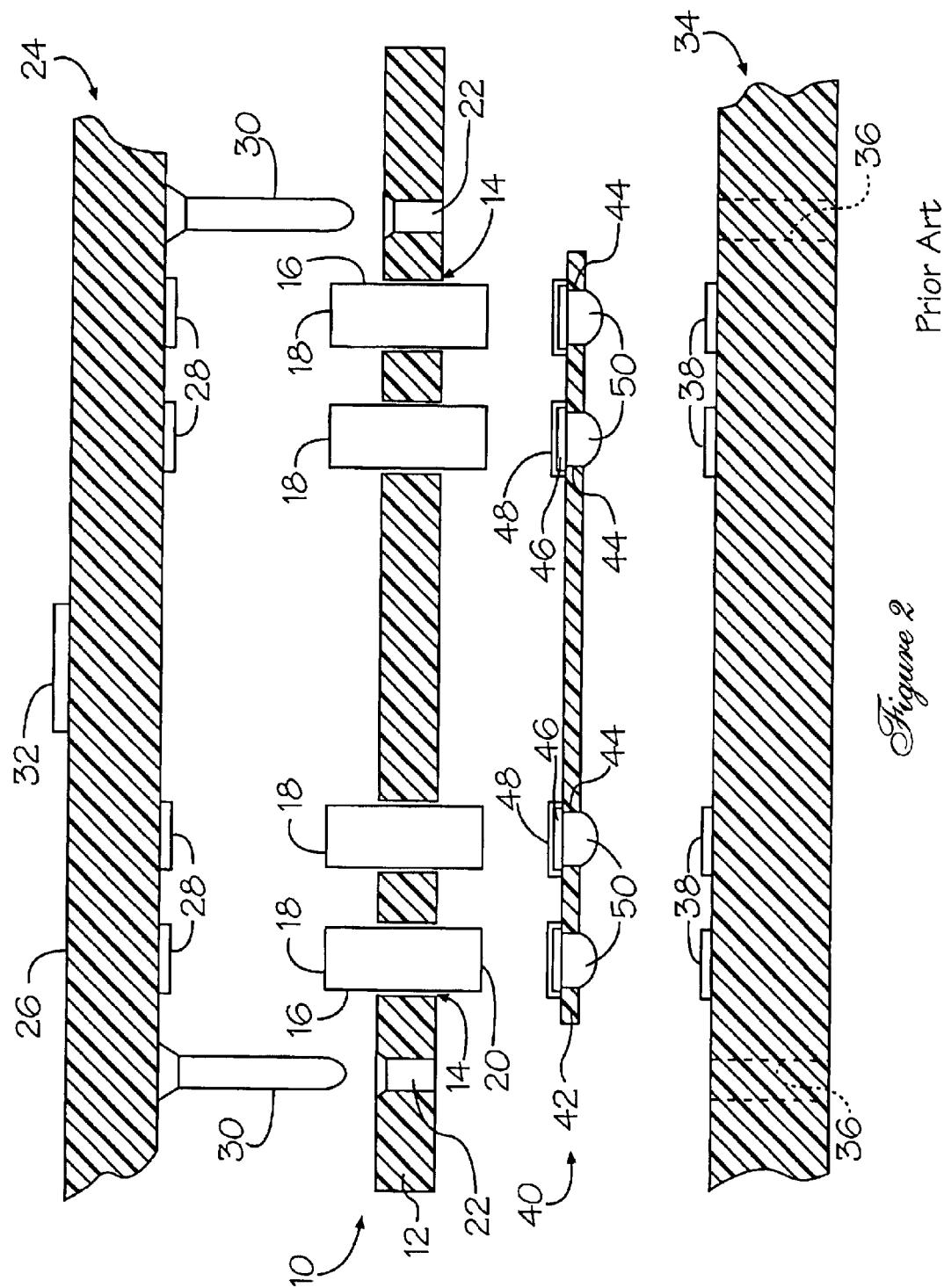
FIG. 2 is a side view, in section and on an enlarged scale, of a prior art interposer shown in FIG. 1, the interposer being positioned for attachment to a circuit member and aligned with a connector and another circuit member for eventually providing interconnection therebetween.

Referring first to FIGS. 1 and 2, there are shown perspective and side views, respectively, of an interposer 40 of the prior art for providing a reworkable plurality of electrical contact pads 46 for an electrical circuit member 34. Electrical contact pads 46 preferably are plated with a noble metal such as gold. When used in conjunction with a connector 10, a path for electrically interconnecting a pair of electrical circuit members 24 and 34 is provided. Examples of circuit members suitable for interconnection through interposer 40 include printed circuit boards, circuit modules, etc. The term "printed circuit board" is meant to include but not be limited to a multilayered circuit structure including one or more conductive (i.e., signal, power and/or ground) layers therein. Such printed circuit boards, also known as printed wiring boards, are well known in the art and further description is not believed necessary. The term "circuit module" is meant to include a substrate or like member having various electrical components (e.g., semiconductor chips, conductive circuitry, conductive pins, etc.), which may form part thereof. Such modules are also well known in the art and further description is not believed necessary.

Interposer 40 includes a dielectric layer 42 having a plurality of internal apertures or openings 44, each one corresponding to and being aligned with a conductive pad 46. In one example, dielectric layer 42 is composed of a material such Kapton (a trademark of E. I. DuPont deNemours & Co., Wilmington, Del.) or Upilex (a trademark of Ube Industries, Ltd., Japan) and is 0.010-inch thick. The openings 44 are typically cylindrical in shape and are formed by a Kapton-etch process. Conductive pads 46 are composed of copper and covered by a plating layer 48, which in this example is composed of a 200 micro-inch thick layer of nickel covered by a 50 micro-inch thick layer of gold.

After alignment by methods well known in the art (e.g., pin and hole, optical alignment, etc.), interposer 40 can be electrically attached to flat conductive pads (e.g., copper terminals) 38 located on an upper surface of electrical circuit member 34 by a process appropriate for the particular composition of the conductive members 50. For example, if the conductive members 50 are solder, infrared or hot air reflow can be used to attach the interposer 40 to the pads 38.

Figure 3:
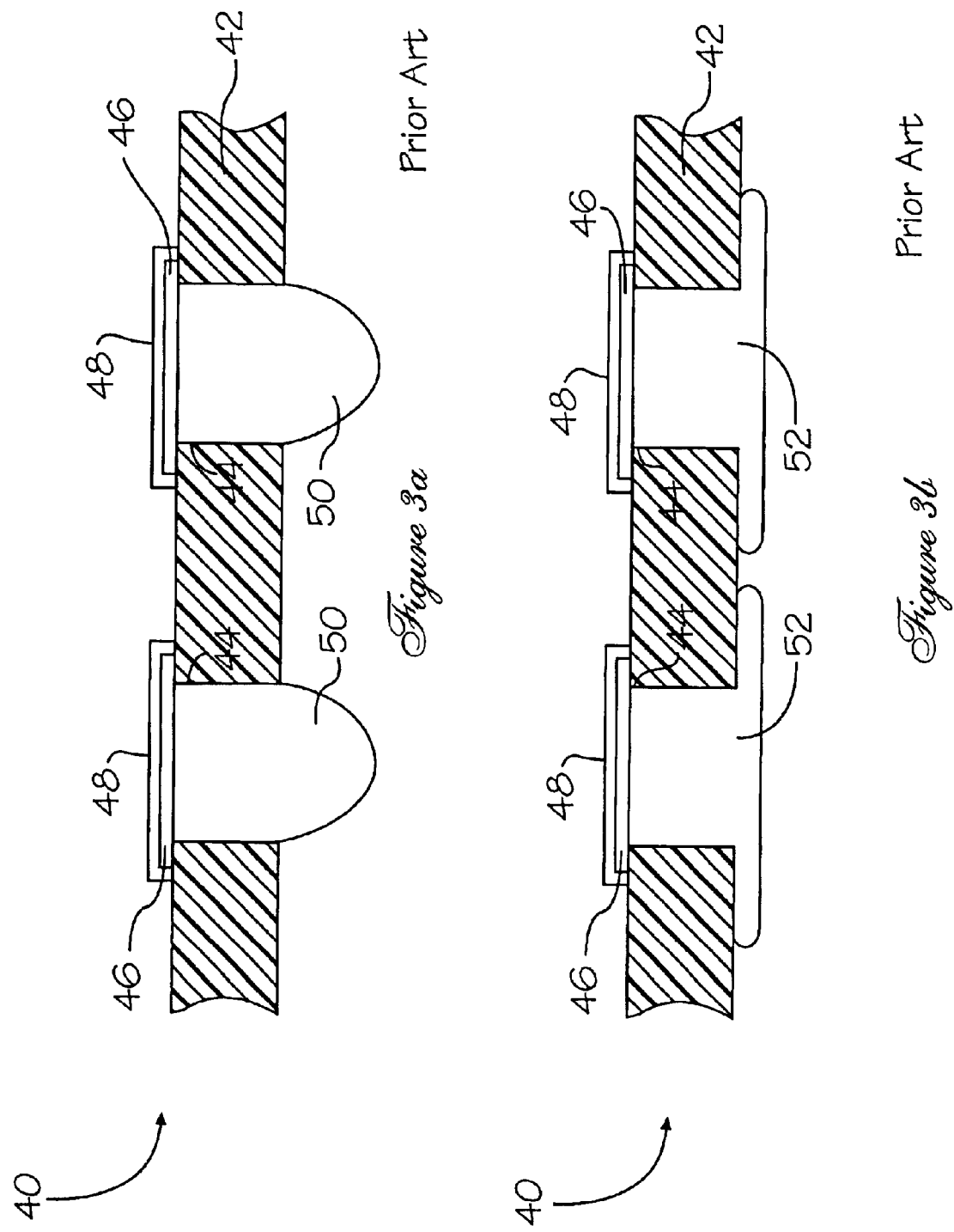
FIGS. 3a and 3b are an enlarged side view of the interposer of FIG. 1 before and with, respectively, the effects of creep of the solder connections.

Referring now to FIGS. 3a and 3b, there is shown an enlarged side view of interposer 40 of the prior art before and with, respectively, the effects of creep of the solder connections. Conductive members 50 (FIG. 3a) (e.g. solder connections) are located in corresponding openings 44 and are in electrical contact with corresponding conductive pads 46.

As stated hereinabove, because of the combination of increased temperature of today's hotter-running semiconductors along with the clamping forces of LGA connectors, conductive members 52 (FIG. 3b) can flatten out due to creep, thereby relaxing the contact force necessary to maintain electrical contact and producing connector failures.

After alignment by methods well known in the art (e.g., pin and hole, optical alignment, etc.), interposer 40 can be electrically attached to flat conductive pads (e.g., copper terminals) 38 located on an upper surface of electrical circuit member 34 by a process appropriate for the particular composition of the conductive members 50. For example, if the conductive members 50 are solder, infrared or hot air reflow can be used to attach the interposer 40 to the pads 38.

Figure 4:
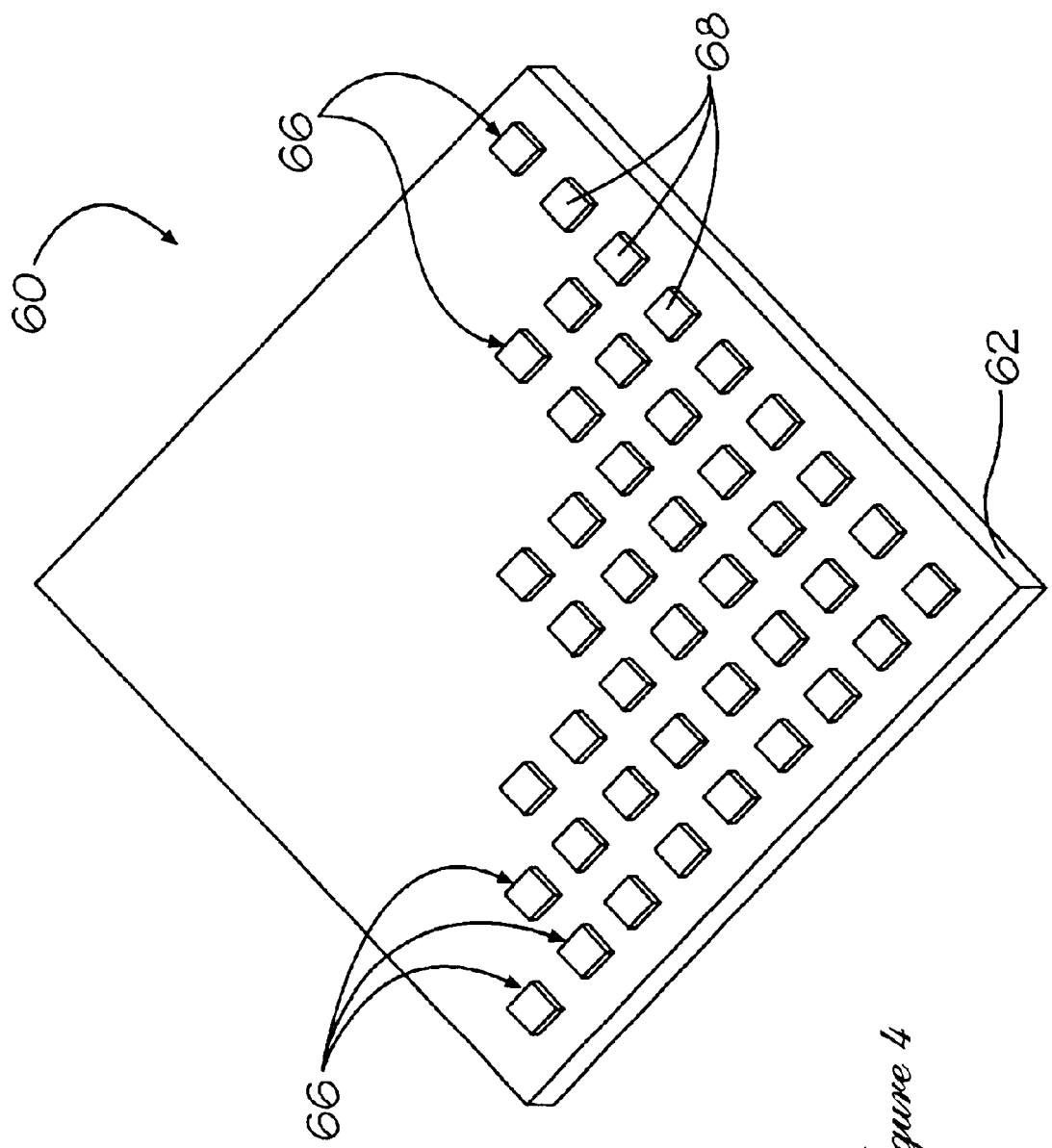
FIG. 4 is a partial perspective view of an electrical connector in accordance with one embodiment of the present invention.
Figure 5:
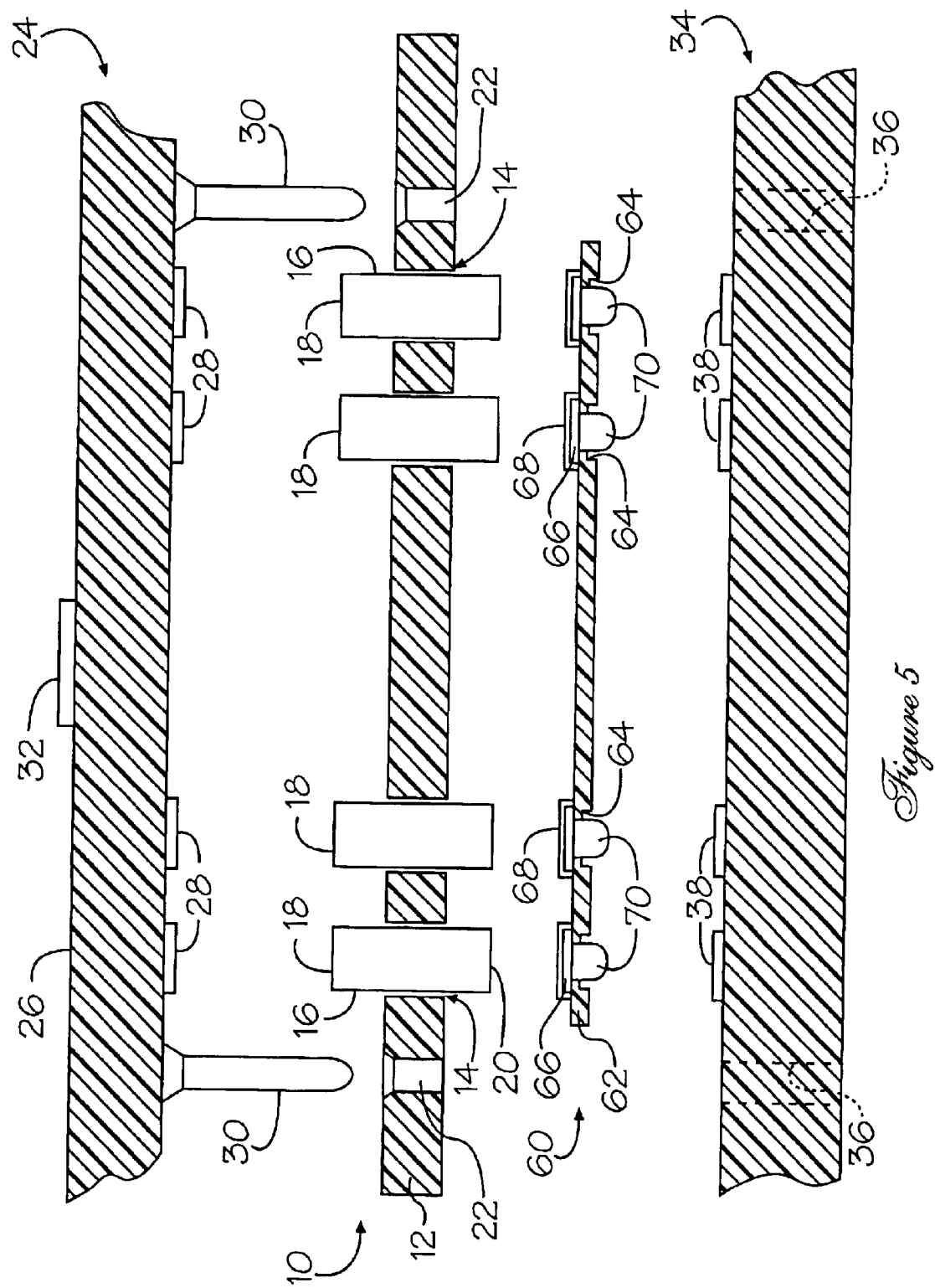
FIG. 5 is a side view, in section and on an enlarged scale, of the connector shown in FIG. 4.

Referring now to FIGS. 4, and 5, there are shown perspective and side views, respectively, of an interposer 60 of the present invention for providing a reworkable plurality of electrical contact pads 66 for an electrical circuit member 34. Electrical contact pads 66 preferably are plated with a noble metal such as gold. When used in conjunction with a connector 10, a path for electrically interconnecting a pair of electrical circuit members 24 and 34 is provided. Examples of circuit members suitable for interconnection through interposer 60 include printed circuit boards, circuit modules, etc.

Interposer 60 includes a dielectric layer 62 having a plurality of internal stepped apertures or openings 64, each one corresponding to and aligned with a conductive pad 66. The stepped aperture 64 provides the spacer of height (step height) necessary to ensure the maintenance of the force on the connector contacts. In one example, dielectric layer 62 is composed of KAPTON or UPILEX material and is 0.010-inch thick. Other examples of suitable material for dielectric layer 62 are liquid crystal polymer (LCP) and epoxy-glass-based materials (i.e., FR4). Dielectric layer 62 has a coefficient of thermal expansion (CTE) that substantially matches the CTE of the surrounding structures. Dielectric layer 62 may also be comprised of more than one layer of material to allow the implementation of alternate methods of manufacture.

Conductive members 70 (e.g., solder connections) are intended to be located in corresponding stepped openings 64 and are in electrical contact with corresponding conductive pads 66. In one example, the diameter of conductive member 70 is 0.026 inch at its root and the height is 0.030 inch prior to attaching to the motherboard 34. Conductive pads 66 are composed of copper and covered by plating layer 68, which in this example is composed of a 200 micro-inch thick layer of nickel covered by a 50 micro-inch thick layer of gold for good electrical contact. In one example, the center-to-center distance of conductive pads 66 is 0.050 inch, but could be reduced to about 0.040 inch or smaller if required.

Referring now to FIGS. 6a and 6b, there is shown an enlarged side view of interposer 60 of the present invention prior to and including, respectively, the effects of creep of the solder connections. The novel stepped openings 64 are again typically cylindrical in shape. In one example, the upper portion 72 of opening 64 that abuts conductive pad 66 is the same diameter as prior art opening 44 (FIG. 2), while the lower portion 74 is larger in diameter and acts as a reservoir to better contain the volume of conductive material of each conductive member 76 (FIG. 6b). The added height of the spacer ensures that the force on the connector contacts is maintained but is not so excessive as to undermine the integrity of the solder connections due to the non-planarity of the circuit members 24 and 34 and the interposer 60. In one example, the diameter of upper portion 72 of opening 64 is 0.026 inch and the height is 0.010 inch, while the diameter of lower portion 74 is 0.035 inch and the height of the spacer is 0.010 inch.

While a stepped opening 64 has been chosen for purposes of disclosure, it should be obvious that the principles taught by the instant invention can be applied using openings of many different shapes and sizes to accommodate specific design requirements.

Also, while the primary material for conductive members 70 and 76 has been chosen to be solder for purposes of disclosure, it should be obvious that the principles taught by the instant invention can be applied to other materials including conductive adhesives.

After alignment by methods well known in the art (e.g., pin and hole, optical alignment, etc.), interposer 60 can be electrically attached to flat conductive pads (e.g., copper terminals) 38 located on an upper surface of electrical circuit member 34 by a process appropriate for the particular material of conductive members 70. For example if the conductive members are solder, infrared or hot air reflow would be possible options. A pressure may be applied during reflow so that the shape of conductive members 76 will be as shown in FIG. 6b.

It is possible that some conductive member/pad combinations may be used for reasons other than for electrical interconnection (e.g., mechanical or thermal benefits), which are well within the scope of the invention. Furthermore it should be obvious to those skilled in the art that the specific shape of conductive members 70 need not be truly spherical, and that many other shapes, including but not limited to columns, may prove advantageous depending on performance requirements, and assembly equipment and processes available.

It should be clearly seen that interposer 60, once conductive members 70 are properly attached to conductive pads 38 of electrical circuit member 34, provides an electrical path interconnecting the circuitry of electrical circuit member 34 through opposing ends 20 and 18 of each contact member 16 of connector 10 to conductive pads 28. Pads 28 are located on the bottom, external surface of electrical circuit member 24, thereby completing the path to electrical circuit member 24, which may include a substrate 26 having a plurality of semiconductor elements 32 thereon. Conductive pads 28 and 38 understandably may provide signal, power or ground connections, depending on the operational requirements of the respective circuit member.

Each resilient contact member 16 of connector 10 is thus compressed during engagement to form the appropriate interconnection between corresponding pairs of conductive pads 28 and 66. This may be accomplished by many different retentive methods including clamping means as well as many other methods well known to those skilled in the art.

Although connector 10 may be of the type shown in the prior art, it is preferably of a construction and composition as taught in the referenced copending U.S. patent applications.

Alignment of the circuit members 24 and 34 relative to interim connector 10 may be provided utilizing a pair of protruding pins 30, which extends from one of the circuit members (e.g., module 24). These pins are aligned with and positioned within corresponding openings 22 within carrier member 12 and openings 36 (shown-in phantom lines) within the other circuit member 34. It should be understood that other means of alignment are readily possible, including the provision of pins extending from opposing surfaces of carrier member 12 for inversion within corresponding openings within the respective circuit members. To adjust for tolerancing, one of the openings 22 within connector 10 may be of an elongated configuration, forming a slot, for example.

Interposer 60 may be constructed in many different ways. For the example where the dielectric layer is composed of two layers of material, such as polyimide or FR4, a preferred method is to start with a first dielectric layer and create the necessary openings in it. The first dielectric layer is laminated to a copper layer. The copper layer is masked off to allow precious metal plating of the areas that will become the conductive pads and other features such as alignment fiducials. Once the mask is removed, the excess copper is etched away by appropriate etching means. Openings are created in a second dielectric layer. A layer of adhesive is placed between and aligned with the two dielectric layers for lamination of the structure. In one case a temperature of 185 degrees F. and a pressure of 20 pounds per square inch (PSI) were used. If all layers are properly aligned, the stepped openings are formed and are in alignment with contact pads. Once this operation is complete, the overall structure is turned over and conductive material such as solder paste is screened on into the appropriate openings. The structure is sent through a reflow oven to form the conductive members. The interposer is then ready for attachment to an appropriate electronic packaging structure, such as a printed circuit board.

For the example where the dielectric layer is composed of a single layer of material, such as polyimide, FR4, or LCP, a preferred method is to start with the dielectric layer and create the necessary openings in it. The stepped openings may be created in many different ways including a stepped drill, standard drilling operations, routing, etching, or other methods well known in the art. The dielectric layer is laminated to a copper layer. The copper layer is masked off to allow precious metal plating of the areas that will become the conductive pads and other features such as alignment fiducials. Once the mask is removed, the excess copper is etched away by appropriate etching means. If all layers are properly aligned, the stepped openings are formed and are in alignment with contact pads. Once this operation is complete, the overall structure is turned over and conductive material such as solder paste is screened on into the appropriate openings. The structure is sent through a reflow oven to form the conductive members. The interposer is then ready for attachment to an appropriate electronic packaging structure, such as a printed circuit board.

Since other modifications and changes varied to fit if particular operating requirements and environments will be apparent to those skilled in the art, this invention is not considered limited to the examples chosen for purposes of this disclosure, and covers all changes and modifications which does not constitute departures from the true spirit and scope of this invention.

Having thus described the invention, what is desired to be protected by Letters Patent is presented in the subsequently appended claims.

What is claimed is:

1. A low cost, high reliability interposer for use in electronic packages, comprising:
   a) at least one dielectric layer having one major surface and at least one edge;
   b) a plurality of conductive pads, each having a first and second surface, spaced apart on said major surface of said at least one dielectric layer, said first surface of said conductive pads being plated with at least one layer of metal, and at least a portion of said second surface of said conductive pads being readily adaptable for connection to a conductive member;
   c) a plurality of openings disposed in the interposer, said openings having a stepped cross section, each opening corresponding to and aligned with one of said conductive pads; and
   d) a plurality of reformable conductive members, each one located within one of said openings of said interposer and in electrical contact with said portion of said second surface of said conductive pads.

2. The interposer as recited in claim 1, wherein said at least one dielectric layer comprises an insulative material.

3. The interposer as recited in claim 2, wherein said insulative material is polyimide.

4. The interposer as recited in claim 2, wherein said insulative material is a liquid crystal polymer.

5. The interposer as recited in claim 2, wherein said insulative material is epoxy-glass-based.

6. The interposer as recited in claim 2, wherein said insulative material has a coefficient of thermal expansion (CTE) that substantially matches the CTE of the material to which it is to be attached.

7. The interposer as recited in claim 1, wherein said conductive pads comprise copper.

8. The interposer as recited in claim 1, wherein said first surface of said conductive pads being plated with at least one layer of metal is plated with nickel.

9. The interposer as recited in claim 8, wherein said first surface of said conductive pads being plated with at least one layer of metal is also plated with gold.

10. The interposer as recited in claim 1, wherein said conductive members comprise solder.

11. The interposer as recited in claim 1, wherein said conductive members are comprised of conductive paste.

12. The interposer as recited in claim 11, wherein said conductive paste comprises solder paste.

13. The interposer as recited in claim 1, further comprises alignment means to align said carrier to a structure adapted to mate therewith.

14. The interposer as recited in claim 1, wherein said interposer may be attached to a structure adapted to mate therewith by a reflow process.

15. The interposer as recited in claim 14, wherein said reflow process of said interposer to said structure is performed under uniform pressure.

* * * * *